United States Patent
Kwak

(10) Patent No.: US 11,189,328 B1
(45) Date of Patent: Nov. 30, 2021

(54) SEMICONDUCTOR DEVICES AND SEMICONDUCTOR SYSTEMS

(71) Applicant: SK hynix Inc., Icheon-si (KR)

(72) Inventor: Noh Hyup Kwak, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/030,998

(22) Filed: Sep. 24, 2020

(30) Foreign Application Priority Data

May 15, 2020 (KR) .................. 10-2020-0058337

(51) Int. Cl.
| | |
|---|---|
| *G11C 7/10* | (2006.01) |
| *G11C 7/22* | (2006.01) |
| *G11C 8/18* | (2006.01) |
| *G11C 7/14* | (2006.01) |

(52) U.S. Cl.
CPC ............ *G11C 7/222* (2013.01); *G11C 7/1009* (2013.01); *G11C 7/1084* (2013.01); *G11C 7/14* (2013.01); *G11C 8/18* (2013.01)

(58) Field of Classification Search
CPC ..... G11C 7/222; G11C 7/1009; G11C 7/1084; G11C 7/14; G11C 8/18
USPC ...................................... 365/233.1
See application file for complete search history.

(56) References Cited

U.S. PATENT DOCUMENTS

| | | |
|---|---|---|
| 8,972,685 B2 | 3/2015 | Bains et al. |
| 2014/0181390 A1* | 6/2014 | Bains ............... G11C 7/1072 711/105 |

FOREIGN PATENT DOCUMENTS

KR    100968417 B1    7/2010

* cited by examiner

*Primary Examiner* — Xiaochun L Chen
(74) *Attorney, Agent, or Firm* — William Park & Associates Ltd.

(57) ABSTRACT

A semiconductor device includes an input control circuit and an internal command generation circuit. The input control circuit is synchronized with a first pulse of an internal clock signal to generate an internal chip selection signal and a first internal command/address signal from a chip selection signal and a command/address signal. In addition, the input control circuit is synchronized with a second pulse of the internal clock signal to inhibit generation of the internal chip selection signal. The internal command generation circuit generates a first active command and a second active command which are sequentially enabled when the internal chip selection signal and the first internal command/address signal have a predetermined logic level combination.

30 Claims, 16 Drawing Sheets

SEMICONDUCTOR DEVICES AND SEMICONDUCTOR SYSTEMS

CROSS-REFERENCE TO RELATED APPLICATIONS

The present application claims priority under 35 U.S.C 119(a) to Korean Patent Application No. 10-2020-0058337, filed on May 15, 2020, which is incorporated herein by reference in its entirety.

BACKGROUND

1. Technical Field

Embodiments of the present disclosure relate to semiconductor devices generating an active command for performing an active operation from a command and an address successively input and semiconductor systems including the semiconductor devices.

2. Related Art

In general, semiconductor devices such as double data rate synchronous dynamic random access memory (DDR SDRAM) devices are configured to perform a read operation or a write operation according to a command provided by an external chip set device. In order that the semiconductor devices perform the read operation or the write operation, each of the semiconductor devices has to perform an active operation. The semiconductor devices may successively receive a command and an address through a command/address pin to generate an active command and an internal address for performing an active operation and may separate the command from the address using a chip selection signal.

Meanwhile, a frequency of a clock signal used in semiconductor devices have increased to improve an operation speed of the semiconductor devices. As the frequency of the clock signal increases, internal commands for performing unnecessary operations may be generated by a command and an address which are iteratively input to the semiconductor devices in synchronization with the clock signal. Thus, various techniques have been proposed to prevent generation of the internal commands performing the unnecessary operations.

SUMMARY

According to an embodiment, a semiconductor device may include an input control circuit and an internal command generation circuit. The input control circuit may be synchronized with a first pulse of an internal clock signal to generate an internal chip selection signal and a first internal command/address signal from a chip selection signal and a command/address signal. In addition, the input control circuit may be synchronized with a second pulse of the internal clock signal to inhibit generation of the internal chip selection signal. The internal command generation circuit generates a first active command and a second active command which are sequentially enabled when the internal chip selection signal and the first internal command/address signal have a predetermined logic level combination.

According to another embodiment, a semiconductor device may include an input control circuit and an internal command generation circuit. The input control circuit may be synchronized with a first pulse of a first internal clock signal to generate a first internal chip selection signal and a first internal command/address signal from a chip selection signal and a command/address signal. In addition, the input control circuit may be synchronized with a first pulse of a second internal clock signal to generate a second internal chip selection signal and a second internal command/address signal from the chip selection signal and the command/address signal. Moreover, the input control circuit may be synchronized with second pulses of the first and second internal clock signals to inhibit the first and second internal chip selection signals from being generated. The internal command generation circuit generates a first active command and a second active command which are sequentially enabled when the first internal chip selection signal and the first internal command/address signal have a predetermined logic level combination. In addition, the internal command generation circuit generates a third active command and a fourth active command which are sequentially enabled when the second internal chip selection signal and the second internal command/address signal have a predetermined logic level combination.

DETAILED DESCRIPTION

In the following description of the embodiments when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, and vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter with reference to the accompanying drawings. However, the embodiments described herein are for illustrative purposes only and are not intended to limit the scope of the present disclosure.

Figure 1:
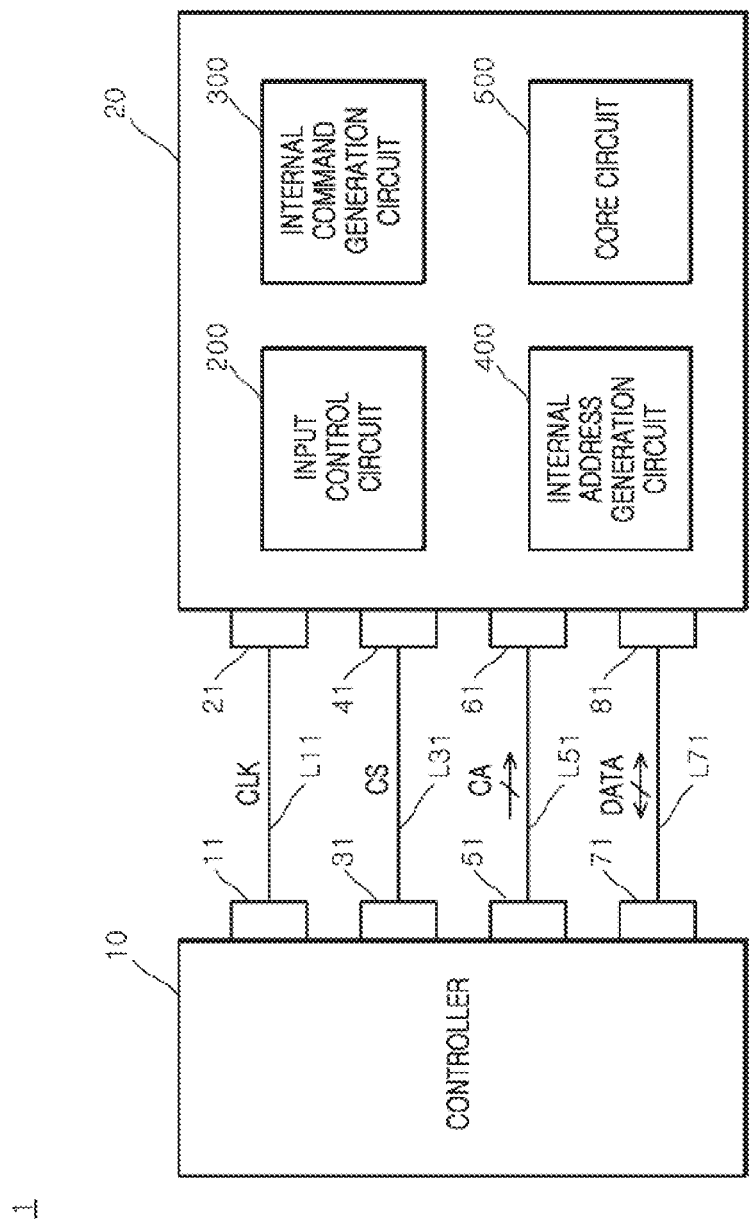
FIG. 1 is a block diagram illustrating a configuration of a semiconductor system according to an embodiment of the present disclosure.

As illustrated in FIG. 1, a semiconductor system 1 according to an embodiment may include a controller 10 and a semiconductor device 20. The semiconductor device 20 may include an input control circuit 200, an internal command generation circuit 300, an internal address generation circuit 400, and a core circuit 500.

The controller 10 may include a first control pin 11, a second control pin 31, a third control pin 51, and a fourth control pin 71. The semiconductor device 20 may include a first semiconductor pin 21, a second semiconductor pin 41, a third semiconductor pin 61, and a fourth semiconductor pin 81. The first control pin 11 and the first semiconductor pin 21 may be connected to each other by a first transmission line L11. The second control pin 31 and the second semiconductor pin 41 may be connected to each other by a second transmission line L31. The third control pin 51 and the third semiconductor pin 61 may be connected to each other by a third transmission line L51. The fourth control pin 71 and the fourth semiconductor pin 81 may be connected to each other by a fourth transmission line L71. The controller 10 may transmit a clock signal CLK to the semiconductor device 20 through the first transmission line L11 to control the semiconductor device 20. The controller 10 may transmit a chip selection signal CS to the semiconductor device 20 through the second transmission line L31 to control the semiconductor device 20. The controller 10 may transmit a command/address signal CA to the semiconductor device 20 through the third transmission line L51 to control the semiconductor device 20. The controller 10 may receive data DATA from the semiconductor device 20 or may transmit the data DATA to the semiconductor device 20, through the fourth transmission line L71.

The controller 10 may output the clock signal CLK, the chip selection signal CS, the command/address signal CA, and the data DATA to the semiconductor device 20 to perform an active operation. The controller 10 may receive the data DATA from the semiconductor device 20 during the active operation. The active operation may include a write operation, a read operation, and a refresh operation. The chip selection signal CS and the command/address signal CA may be iteratively generated in synchronization with odd pulses or even pulses included in the clock signal CLK.

The input control circuit 200 may be synchronized with first pulses of internal clock signals (ODD and EVEN of FIG. 2) generated from the clock signal CLK to generate internal chip selection signals (ICSA and ICSB of FIG. 2) and internal command/address signals (ICAA<1:2> and ICAB<1:2> of FIG. 2) from the chip selection signal CS and the command/address signal CA. The input control circuit 200 may be synchronized with second pulses of the internal clock signals (ODD and EVEN of FIG. 2) generated from the clock signal CLK to inhibit generation of the internal chip selection signals (ICSA and ICSB of FIG. 2). The input control circuit 200 may be synchronized with the first and second pulses of the internal clock signals (ODD and EVEN of FIG. 2) to generate internal command/address signals (ICAA<3:M> and ICAB<3:M> of FIG. 2) from the command/address signal CA.

The internal command generation circuit 300 may generate first and second active commands (ACT1 and ACT2 of FIG. 2) which are sequentially enabled when the internal chip selection signals (ICSA and ICSB of FIG. 2) and the internal command/address signals (ICAA<1:2> and ICAB<1:2> of FIG. 2) have a predetermined logic level combination. The internal command generation circuit 300 may generate third and fourth active commands (ACT3 and ACT4 of FIG. 2) which are sequentially enabled when the internal chip selection signals (ICSA and ICSB of FIG. 2) and the internal command/address signals (ICAA<1:2> and ICAB<1:2> of FIG. 2) have a predetermined logic level combination. The predetermined combination of logic levels to be described later means that the logic levels of signals are set to the same logic level combination.

Figure 2:
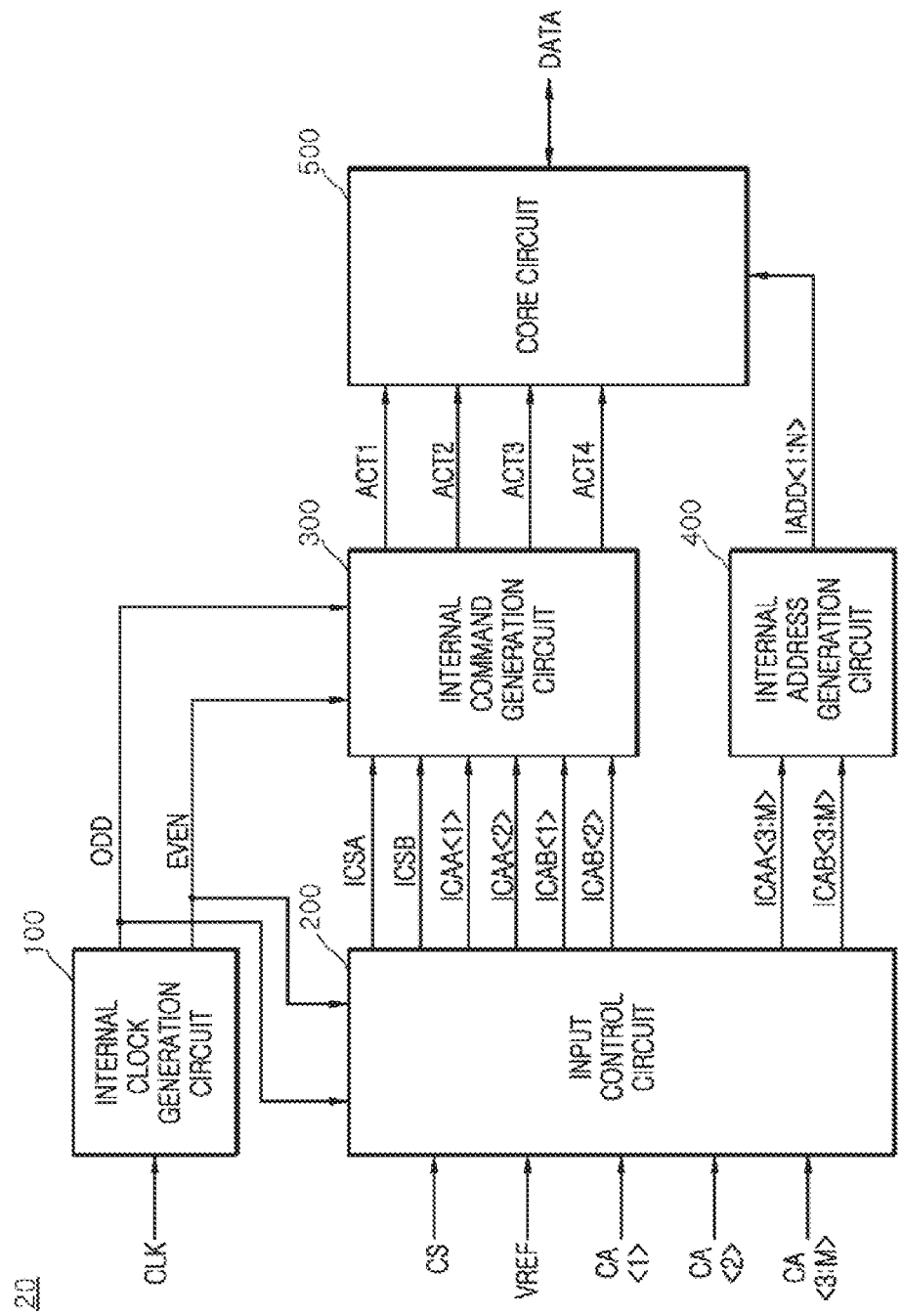
FIG. 2 is a block diagram illustrating a configuration of a semiconductor device included in the semiconductor system illustrated in FIG. 1.

The internal address generation circuit 400 may decode the internal command/address signals (ICAA<3:M> and ICAB<3:M> of FIG. 2) to generate an internal address (IADD<1:N> of FIG. 2).

The core circuit 500 may perform the active operation for receiving or outputting the data DATA based on the first and second active commands (ACT1 and ACT2 of FIG. 2) and the internal address (IADD<1:N> of FIG. 2), The core circuit 500 may perform the active operation for receiving or outputting the data DATA based on the third and fourth active commands (ACT3 and ACT4 of FIG. 2) and the internal address (IADD<1:N> of FIG. 2). The core circuit 500 may perform the active operation for executing the refresh operation based on the first and second active commands (ACT1 and ACT2 of FIG. 2) and the internal address (IADD<1:N> of FIG. 2). The core circuit 500 may perform the active operation for executing the refresh operation based on the third and fourth active commands (ACT3 and ACT4 of FIG. 2) and the internal address (IADD<1:N> of FIG. 2).

FIG. 2 is a block diagram illustrating a configuration of the semiconductor device 20. As illustrated in FIG. 2, the semiconductor device 20 may include an internal clock generation circuit 100, the input control circuit 200, the internal command generation circuit 300, the internal address generation circuit 400, and the core circuit 500.

The internal clock generation circuit 100 may receive the clock signal CLK to generate a first internal clock signal ODD and a second internal clock signal EVEN having a divided frequency. The internal clock generation circuit 100 may generate the first internal clock signal ODD which is enabled in synchronization with the odd pulses included in the clock signal CLK. The internal clock generation circuit 100 may generate the second internal clock signal EVEN which is enabled in synchronization with the even pulses included in the clock signal CLK. Operations for generating the first and second internal clock signals ODD and EVEN from the lock signal CLK input to the internal clock generation circuit 100 will be described with reference to FIG. 3 later.

The input control circuit 200 may generate a first internal chip selection signal ICSA from the chip selection signal CS which is input in synchronization with a first pulse of the first internal clock signal ODD. The input control circuit 200 may generate a second internal chip selection signal ICSB from the chip selection signal CS which is input in synchronization with a first pulse of the second internal clock signal EVEN.

The input control circuit 200 may generate the first and second bit signals ICAA<1:2> of the first internal command/address signal from first and second bit signals CA<1:2> of the command/address signal CA which are input in synchronization with first and second pulses of the first internal clock signal ODD. The input control circuit 200 may generate the first and second bit signals ICAB<1:2> of the second internal command/address signal from first and second bit signals CA<1:2> of the command/address signal CA which are input in synchronization with first and second pulses of the second internal clock signal EVEN.

The input control circuit 200 may generate the third to $M^{th}$ bit signals ICAA<3:M> of the first internal command/address signal from third to $M^{th}$ bit signals CA<3:M> of the command/address signal CA which are input in synchronization with the first and second pulses of the first internal clock signal ODD. The input control circuit 200 may generate the third to $M^{th}$ bit signals ICAB<3:M> of the second internal command/address signal from the third to $M^{th}$ bit signals CA<3:M> of the command/address signal CA which are input in synchronization with the first and second pulses of the second internal clock signal EVEN.

The internal command generation circuit 300 may be synchronized with the first internal clock signal ODD to generate the first and second active commands ACT1 and ACT2 which are sequentially enabled when the first internal chip selection signal ICSA and the first and second bit signals ICAA<1:2> of the first internal command/address signal have a predetermined logic level combination. The internal command generation circuit 300 may be synchronized with the second internal clock signal EVEN to generate the third and fourth active commands ACT3 and ACT4 which are sequentially enabled when the second internal chip selection signal ICSB and the first and second bit signals ICAB<1:2> of the second internal command/address signal have a predetermined logic level combination. The first internal chip selection signal ICSA and the first and second bit signals ICAA<1:2> of the first internal command/address signal having a predetermined logic level combination and the second internal chip selection signal ICSB and the first and second bit signals ICAB<1:2> of the second internal command/address signal having a predetermined logic level combination are the same logic level combination.

The internal address generation circuit 400 may decode the third to $M^{th}$ bit signals ICAA<3:M> of the first internal command/address signal to generate the internal address IADD<1:N>. The internal address generation circuit 400 may decode the third to $M^{th}$ bit signals ICAB<3:M> of the second internal command/address signal to generate the internal address IADD<1:N>.

The core circuit 500 may perform the active operation for receiving or outputting the data DATA based on the first active command ACT1 and the internal address IADD<1:N>. The core circuit 500 may perform the active operation for receiving or outputting the data DATA based on the second active command ACT2 and the internal address IADD<1:N>. The core circuit 500 may perform the active operation for receiving or outputting the data DATA based on the third active command ACT3 and the internal address IADD<1:N>. The core circuit 500 may perform the active operation for receiving or outputting the data DATA based on the fourth active command ACT4 and the internal address IADD<1:N>. The core circuit 500 may perform the active operation for executing the refresh operation based on the first active command ACT1 and the internal address IADD<1:N>. The core circuit 500 may perform the active operation for executing the refresh operation based on the second active command ACT2 and the internal address IADD<1:N>. The core circuit 500 may perform the active operation for executing the refresh operation based on the third active command ACT3 and the internal address IADD<1:N>. The core circuit 500 may perform the active operation for executing the refresh operation based on the fourth active command ACT4 and the internal address IADD<1:N>.

Figure 3:
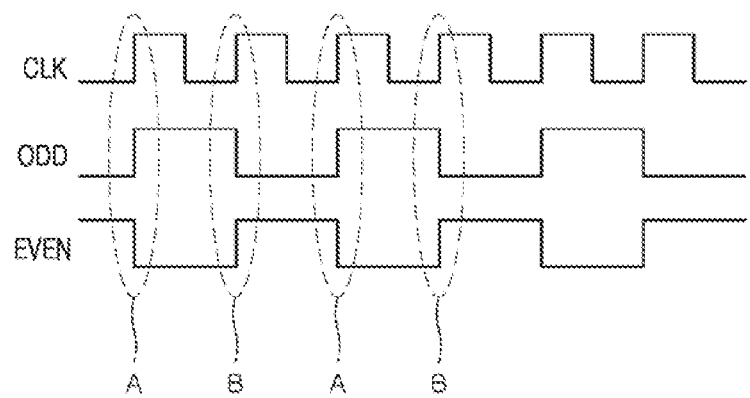
FIG. 3 illustrates an operation of an internal clock generation circuit included in the semiconductor device illustrated in FIG. 2.

An operation of the internal clock generation circuit 100 receiving the clock signal CLK to generate the first and second internal clock signals ODD and EVEN will be described hereinafter with reference to FIG. 3.

The internal clock generation circuit 100 may generate the first internal clock signal ODD including pulses which are created in synchronization with odd pulses A included in the clock signal CLK. The internal clock generation circuit 100 may be synchronized with the odd pulses A included in the clock signal CLK to generate the first internal clock signal ODD having a divided frequency of a frequency of the clock signal CLK.

The internal clock generation circuit 100 may generate the second internal clock signal EVEN including pulses which are created in synchronization with even pulses B included in the clock signal CLK. The internal clock generation circuit 100 may be synchronized with the even pulses B included in the clock signal CLK to generate the second internal clock signal EVEN having a divided frequency of a frequency of the clock signal CLK.

Figure 4:
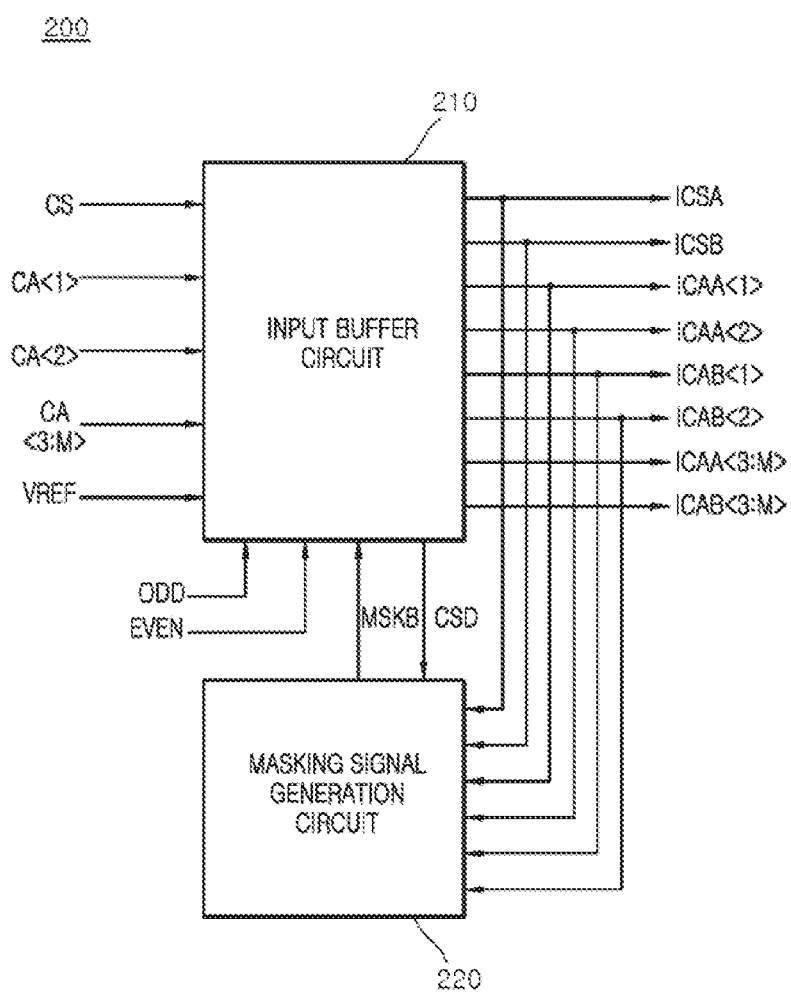
FIG. 4 is a block diagram illustrating a configuration of an input control circuit included in the semiconductor device illustrated in FIG. 2.

FIG. 4 is a block diagram illustrating a configuration of the input control circuit 200. As illustrated in FIG. 4, the input control circuit 200 may include an input buffer circuit 210 and a masking signal generation circuit 220.

The input buffer circuit 210 may compare the chip selection signal CS with a reference voltage VREF in synchronization with the first internal clock signal ODD to generate the first internal chip selection signal ICSA. The input buffer circuit 210 may compare the first and second bit signals CA<1:2> of the command/address signal CA with the reference voltage VREF in synchronization with the first internal clock signal ODD to generate the first and second bit signals ICAA<1:2> of the first internal command/address signal. The input buffer circuit 210 may inhibit generation of the first internal chip selection signal ICSA when a masking signal MSKB is enabled. The input buffer circuit 210 may compare the third to $M^{th}$ bit signals CA<3:M> of the command/address signal CA with the reference voltage VREF in synchronization with the first internal clock signal ODD to generate the third to $M^{th}$ bit signals ICAA<3:M> of the first internal command/address signal. The reference voltage VREF may be set to have a voltage level for determining logic levels of signals used in the semiconductor system 1.

The input buffer circuit 210 may compare the chip selection signal CS with the reference voltage VREF in synchronization with the second internal clock signal EVEN to generate the second internal chip selection signal ICSB. The input buffer circuit 210 may compare the first and second bit signals CA<1:2> of the command/address signal CA with the reference voltage VREF in synchronization with the second internal clock signal EVEN to generate the first and second bit signals ICAB<1:2> of the second internal command/address signal. The input buffer circuit 210 may inhibit generation of the second internal chip selection signal ICSB when the masking signal MSKB is enabled. The input buffer circuit 210 may compare the third to $M^{th}$ bit signals CA<3:M> of the command/address signal CA with the reference voltage VREF in synchronization with the second internal clock signal EVEN to generate the third to $M^{th}$ bit signals ICAB<3:M> of the second internal command/address signal.

The input buffer circuit 210 may delay the chip selection signal CS to generate a delayed chip selection signal CSD.

The masking signal generation circuit 220 may receive the delayed chip selection signal CSD to generate the masking signal MSKB which is enabled when the first internal chip selection signal ICSA and the first and second bit signals ICAA<1:2> of the first internal command/address signal have a predetermined logic level combination. The masking signal generation circuit 220 may receive the delayed chip selection signal CSD to generate the masking signal MSKB which is enabled when the second internal chip selection signal ICSB and the first and second bit signals ICAB<1:2> of the second internal command/address signal have a predetermined logic level combination.

Figure 5:
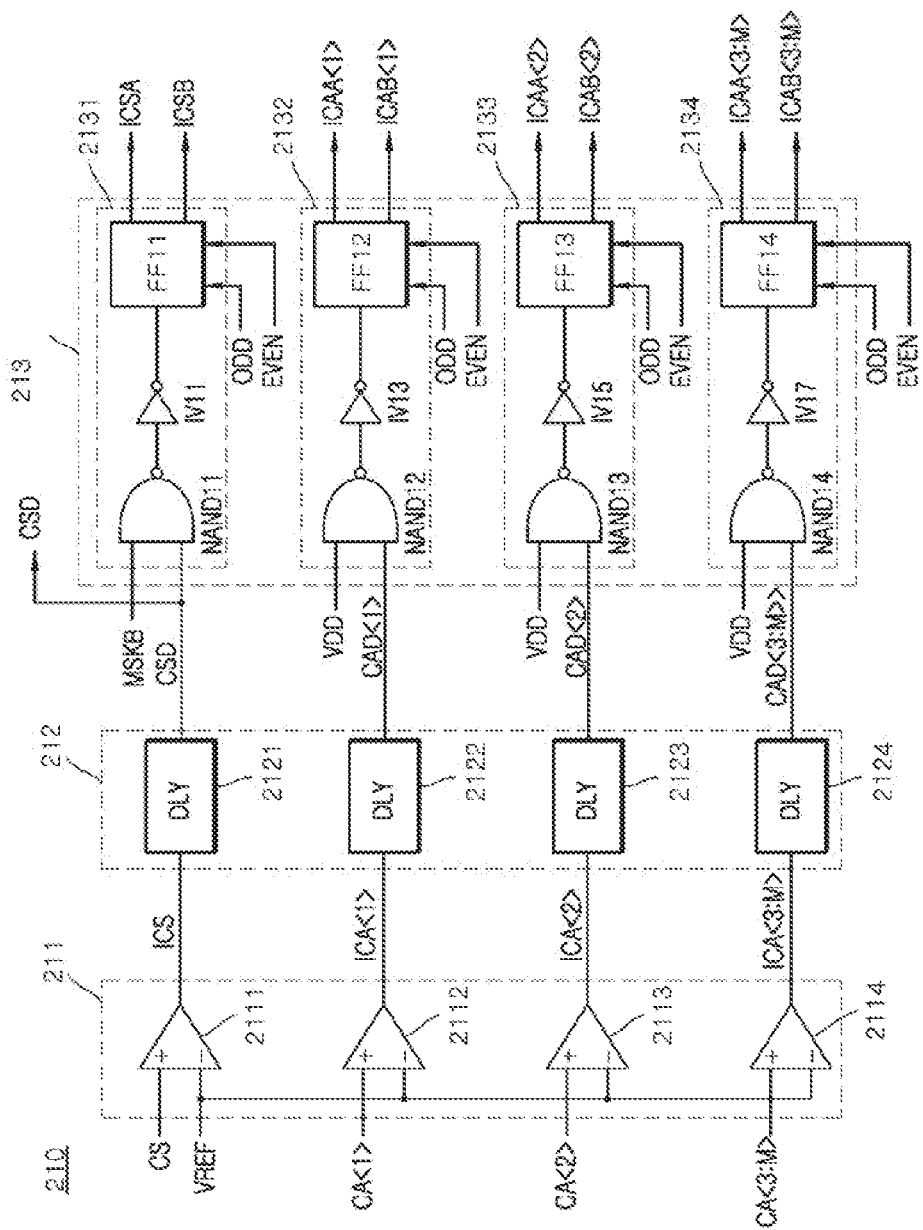
FIG. 5 illustrates a configuration of an input buffer circuit included in the input control circuit illustrated in FIG. 4.

FIG. 5 illustrates a configuration of an example of the input buffer circuit 210. As illustrated in FIG. 5, the input buffer circuit 210 may include a buffer circuit 211, a delay circuit 212, and an internal command/address generation circuit 213.

The buffer circuit 211 may include a first buffer 2111, a second buffer 2112, a third buffer 2113, and a fourth buffer 2114.

The first buffer 2111 may compare the chip selection signal CS with the reference voltage VREF to generate an input chip selection signal ICS. The second buffer 2112 may compare the first bit signal CA<1> of the command/address signal CA with the reference voltage VREF to generate a first bit signal ICA<1> of an input command/address signal. The third buffer 2113 may compare the second bit signal CA<2> of the command/address signal CA with the reference voltage VREF to generate a second bit signal ICA<2> of the input command/address signal. The fourth buffer 2114 may compare the third to $M^{th}$ bit signals CA<3:M> of the command/address signal CA with the reference voltage VREF to generate third to $M^{th}$ bit signals ICA<3:M> of the input command/address signal. Although the fourth buffer 2114 is illustrated with a single circuit, the fourth buffer 2114 may be realized using the same number of circuits as the number of the third to $M^{th}$ bit signals ICA<3:M> of the input command/address signal.

The delay circuit 212 may include a first delay circuit 2121, a second delay circuit 2122, a third delay circuit 2123, and a fourth delay circuit 2124.

The first delay circuit 2121 may delay the input chip selection signal ICS to generate the delayed chip selection signal CSD. The second delay circuit 2122 may delay the first bit signal ICA<1> of the input command/address signal to generate a first bit signal CAD<1> of a delayed input command/address signal. The third delay circuit 2123 may delay the second bit signal ICA<2> of the input command/address signal to generate a second bit signal CAD<2> of the delayed input command/address signal. The fourth delay circuit 2124 may delay the third to $M^{th}$ bit signal ICA<3:M> of the input command/address signal to generate third to $M^{th}$ bit signals CAD<3:M> of the delayed input command/address signal. Although the fourth delay circuit 2124 is illustrated with a single circuit, the fourth buffer 2114 may be realized using the same number of circuits as the number of the third to $M^{th}$ bit signals CAD<3:M> of the delayed input command/address signal. The first delay circuit 2121, the second delay circuit 2122, the third delay circuit 2123, and the fourth delay circuit 2124 may be designed to have the same delay time.

The internal command/address generation circuit 213 may include a first synchronization circuit 2131, a second synchronization circuit 2132, a third synchronization circuit 2133, and a fourth synchronization circuit 2134.

The first synchronization circuit 2131 may be realized using a NAND gate NAND11, an inverter IV11, and a flip-flop FF11, The first synchronization circuit 2131 may be synchronized with the first internal clock signal ODD to generate the first internal chip selection signal ICSA from the delayed chip selection signal CSD according to the masking signal MSKB. The first synchronization circuit 2131 may be synchronized with the second internal clock signal EVEN to generate the second internal chip selection signal ICSB from the delayed chip selection signal CSD according to the masking signal MSKB. The first synchronization circuit 2131 may inhibit generation of the first internal chip selection signal ICSA when the masking signal MSKB is enabled. The first synchronization circuit 2131 may inhibit generation of the second internal chip selection signal ICSB when the masking signal MSKB is enabled.

The second synchronization circuit 2132 may be realized using a NAND gate NAND12, an inverter IV13, and a flip-flop FF12. The second synchronization circuit 2132 may be synchronized with the first internal clock signal ODD to generate the first bit signal ICAA<1> of the first internal command/address signal from the first bit signal CAD<1> of the delayed input command/address signal. The second synchronization circuit 2132 may be synchronized with the second internal clock signal EVEN to generate the first bit signal ICAB<1> of the second internal command/address signal from the first bit signal CAD<1> of the delayed input command/address signal. The NAND gate NAND12 may receive a power supply voltage VDD.

The third synchronization circuit 2133 may be realized using a NAND gate NAND13, an inverter IV15, and a flip-flop FF13. The third synchronization circuit 2133 may be synchronized with the first internal clock signal ODD to generate the second bit signal ICAA<2> of the first internal command/address signal from the second bit signal CAD<2> of the delayed input command/address signal. The third synchronization circuit 2133 may be synchronized with the second internal clock signal EVEN to generate the second bit signal ICAB<2> of the second internal command/address signal from the second bit signal CAD<2> of the delayed input command/address signal. The NAND gate NAND13 may receive a power supply voltage VDD.

The fourth synchronization circuit 2134 may be realized using a NAND gate NAND14, an inverter IV17, and a flip-flop FF14. The fourth synchronization circuit 2134 may be synchronized with the first internal clock signal ODD to generate the third to NO bit signals ICAA<3:11> of the first internal command/address signal from the third to $M^{th}$ bit signals CAD<3:M> of the delayed input command/address signal. The fourth synchronization circuit 2134 may be synchronized with the second internal clock signal EVEN to generate the third to $M^{th}$ bit signals ICAB<3:M> of the second internal command/address signal from the third to $M^{th}$ bit signals CAD<3:M> of the delayed input command/address signal. Although the fourth synchronization circuit 2134 is illustrated with a single circuit, the fourth synchronization circuit 2134 may be realized using the same number of circuits as the number of the third to $M^{th}$ bit signals CAD<3:M> of the delayed input command/address signal. The NAND gate NAND12 may receive a power supply voltage VDD.

Figure 6:
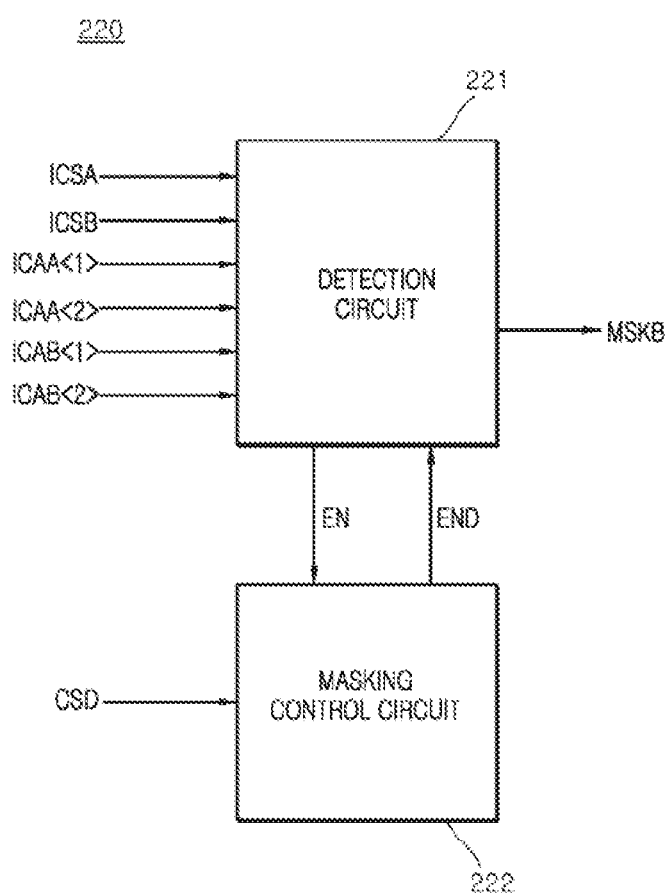
FIG. 6 is a block diagram illustrating a configuration of a masking signal generation circuit included in the input control circuit illustrated in FIG. 4.

FIG. 6 is a block diagram illustrating a configuration of an example of the masking signal generation circuit 220. As illustrated in FIG. 6, the masking signal generation circuit 220 may include a detection circuit 221 and a masking control circuit 222.

The detection circuit 221 may generate an enablement signal EN which is enabled when the first internal chip selection signal ICSA and the first and second bit signals ICAA<1:2> of the first internal command/address signal have a predetermined logic level combination. The detection circuit 221 may generate the masking signal MSKB which is enabled when the first internal chip selection signal ICSA and the first and second bit signals ICAA<1:2> of the first internal command/address signal have a predetermined logic level combination. The detection circuit 221 may generate the masking signal MSKB which is enabled when a delayed enablement signal END is input.

The masking control circuit 222 may delay the enablement signal EN to generate the delayed enablement signal END when the delayed chip selection signal CSD is enabled. The masking control circuit 222 may receive the enablement signal EN when the delayed chip selection signal CSD is disabled. When the delayed chip selection signal CSD is enabled, the masking control circuit 222 may delay the enablement signal EN input previously to generate the delayed enablement signal END.

Figure 7:
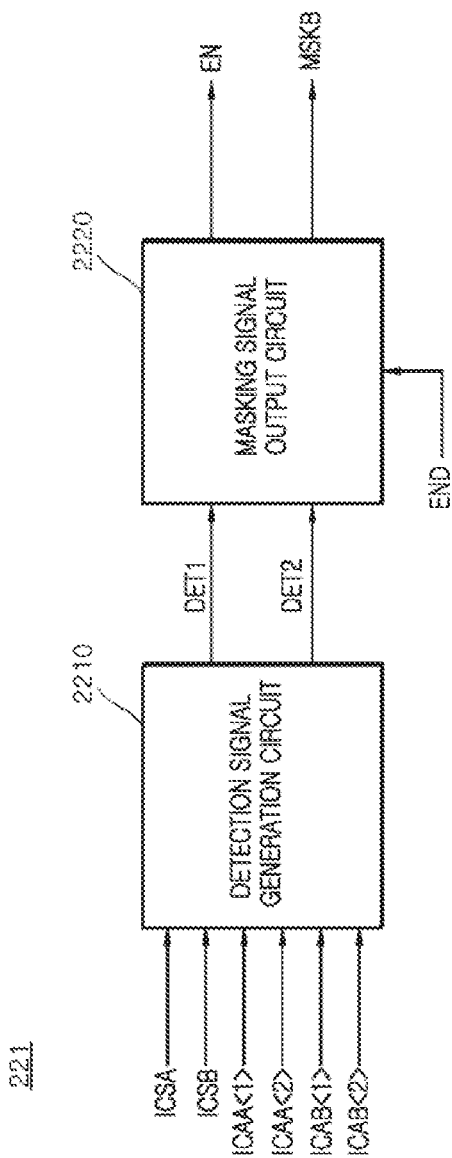
FIG. 7 is a block diagram illustrating a configuration of a detection circuit included in the masking signal generation circuit illustrated in FIG. 6.

FIG. 7 is a block diagram illustrating a configuration of an example of the detection circuit 221. As illustrated in FIG. 7, the detection circuit 221 may include a detection signal generation circuit 2210 and a masking signal output circuit 2220.

The detection signal generation circuit 2210 may generate a first detection signal DET1 which is enabled when the first internal chip selection signal ICSA and the first and second bit signals ICAA<1:2> of the first internal command/address signal have a predetermined logic level combination. The detection signal generation circuit 2210 may generate a second detection signal DET2 which is enabled when the second internal chip selection signal ICSB and the first and second bit signals ICAB<1:2> of the second internal command/address signal have a predetermined logic level combination.

The masking signal output circuit 2220 may generate the enablement signal EN which is enabled when any one of the first detection signal DET1 and the second detection signal DET2 is enabled. The masking signal output circuit 2220 may generate the masking signal MSKB which is enabled when any one of the first detection signal DET1 and the second detection signal DET2 is enabled. The masking signal output circuit 2220 may generate the masking signal MSKB which is enabled when the delayed enablement signal END is enabled.

Figure 8:
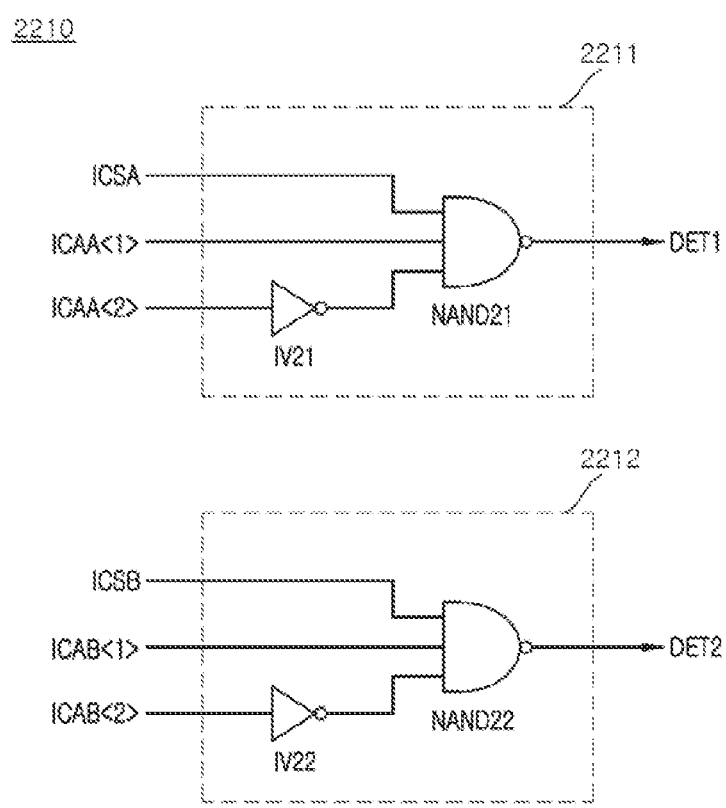
FIG. 8 is a circuit diagram illustrating a configuration of a detection signal generation circuit included in the detection circuit illustrated in FIG. 7.

FIG. 8 is a circuit diagram illustrating a configuration of an example of the detection signal generation circuit 2210. As illustrated in FIG. 8, the detection signal generation circuit 2210 may include a first detection signal generation circuit 2211 and a second detection signal generation circuit 2212.

The first detection signal generation circuit 2211 may be realized using an inverter IV21 and a NAND gate NAND21. The first detection signal generation circuit 2211 may generate the first detection signal DET1 which is enabled when the first internal chip selection signal ICSA and the first and second bit signals ICAA<1:2> of the first internal command/address signal have a predetermined logic level combination. The first detection signal generation circuit 2211 may generate the first detection signal DET1 which is enabled to have a logic "low" level when the first internal chip selection signal ICSA has a logic "high" level, the first bit signal ICAA<1> of the first internal command/address signal has a logic "high" level, and the second bit signal ICAA<2> of the first internal command/address signal has a logic "low" level. The predetermined logic level combination of the first internal chip selection signal ICSA and the first and second bit signals ICAA<1:2> of the first internal command/address signal means that the first internal chip selection signal ICSA has a logic "high" level, the first bit signal ICAA<1> of the first internal command/address signal has a logic "high" level, and the second bit signal ICAA<2> of the first internal command/address signal has a logic "low" level.

The second detection signal generation circuit 2212 may be realized using an inverter IV22 and a NAND gate NAND22. The second detection signal generation circuit 2212 may generate the second detection signal DET2 which is enabled when the second internal chip selection signal ICSB and the first and second bit signals ICAB<1:2> of the second internal command/address signal have a predetermined logic level combination. The second detection signal generation circuit 2212 may generate the second detection signal DET2 which is enabled to have a logic "low" level when the second internal chip selection signal ICSB has a logic "high" level, the first bit signal ICAB<1> of the second internal command/address signal has a logic "high" level, and the second bit signal ICAB<2> of the second internal command/address signal has a logic "low" level. The predetermined logic level combination of the second internal chip selection signal ICSB and the first and second bit signals ICAB<1:2> of the second internal command/address signal means that the second internal chip selection signal ICSB has a logic "high" level, the first bit signal ICAB<1> of the second internal command/address signal has a logic "high" level, and the second bit signal ICAB<2> of the second internal command/address signal has a logic "low" level.

Figure 9:
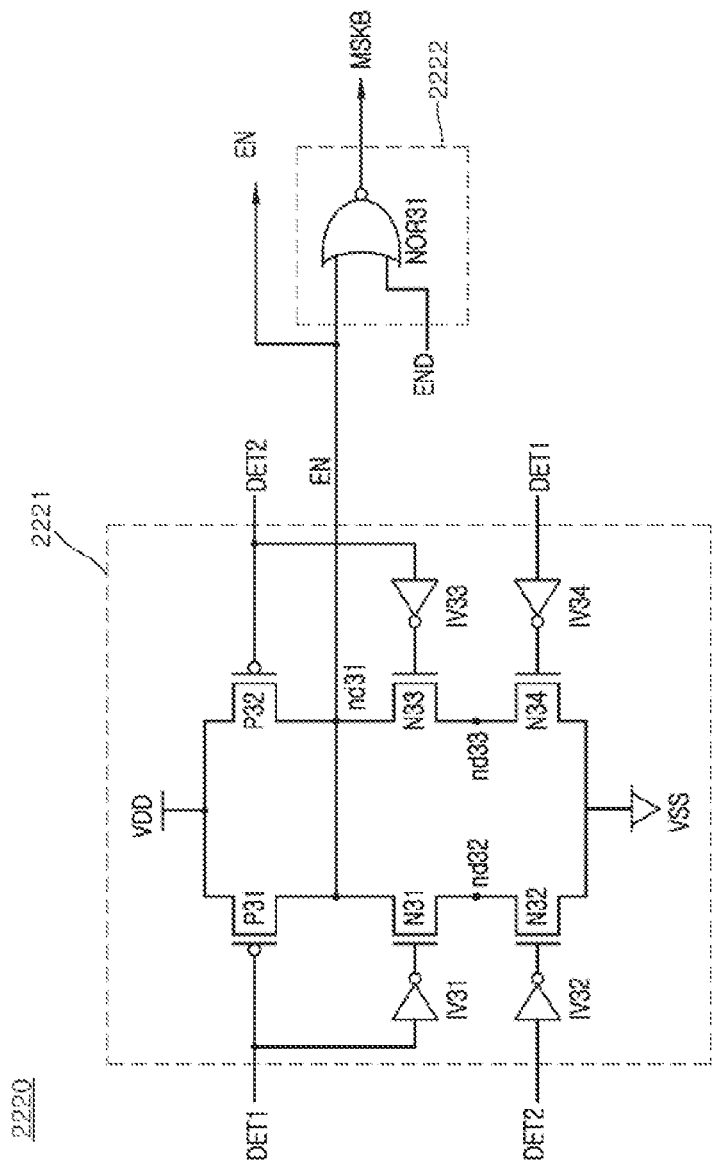
FIG. 9 is a circuit diagram illustrating a configuration of a masking signal output circuit included in the detection circuit illustrated in FIG. 7.

FIG. 9 is a circuit diagram illustrating a configuration of an example of the masking signal output circuit 2220. As illustrated in FIG. 9, the masking signal output circuit 2220 may include a drive circuit 2221 and a logic circuit 2222.

The drive circuit 2221 may be realized using an inverter IV31 inversely buffering the first detection signal DET1 to output the inversely buffered signal of the first detection signal DET1, an inverter IV32 inversely buffering the second detection signal DET2 to output the inversely buffered signal of the second detection signal DET2, an inverter IV33 inversely buffering the second detection signal DET2 to output the inversely buffered signal of the second detection signal DET2, an inverter IV34 inversely buffering the first detection signal DET1 to output the inversely buffered signal of the first detection signal DET1, PMOS transistors P31 and P32 coupled in parallel between a power supply voltage VDD terminal and an internal node nd31 to operate using the first and second detection signals DET1 and DET2 input to respective ones of gates of the PMOS transistors P31 and P32 as input signals, an NMOS transistor N31 coupled between the internal node nd31 and an internal node nd32 to operate using an output signal of the inverter IV31 input to a gate of the NMOS transistor N31 as an input signal, an NMOS transistor N32 coupled between the internal node nd32 and a ground voltage VSS terminal to operate using an output signal of the inverter IV32 input to a gate of the NMOS transistor N32 as an input signal, an NMOS transistor N33 coupled between the internal node nd31 and an internal node nd33 to operate using an output signal of the inverter IV33 input to a gate of the NMOS transistor N33 as an input signal, and an NMOS transistor N34 coupled between the internal node nd33 and the ground voltage VSS terminal to operate using an output signal of the inverter IV34 input to a gate of the NMOS transistor N34 as an input signal.

The drive circuit 2221 may drive the internal node nd31 according logic levels of the first and second detection signals DET1 and DET2 to generate the enablement signal EN. The drive circuit 2221 may pull up the internal node nd31 to the power supply voltage VDD to generate the enablement signal EN having a logic "high" level when any one of the first and second detection signals DET1 and DET2 is enabled to have a logic "low" level. The drive circuit 2221 may pull down the internal node nd31 to the ground voltage VSS to generate the enablement signal EN having a logic "low" level when both of the first and second detection signals DET1 and DET2 are enabled to have a logic "low" level.

The logic circuit 2222 may be realized using a NOR gate NOR31. The logic circuit 2222 may generate the masking signal MSKB which is enabled to have a logic "low" level when any one of the enablement signal EN and the delayed enablement signal END is enabled to have a logic "high" level.

Figure 10:
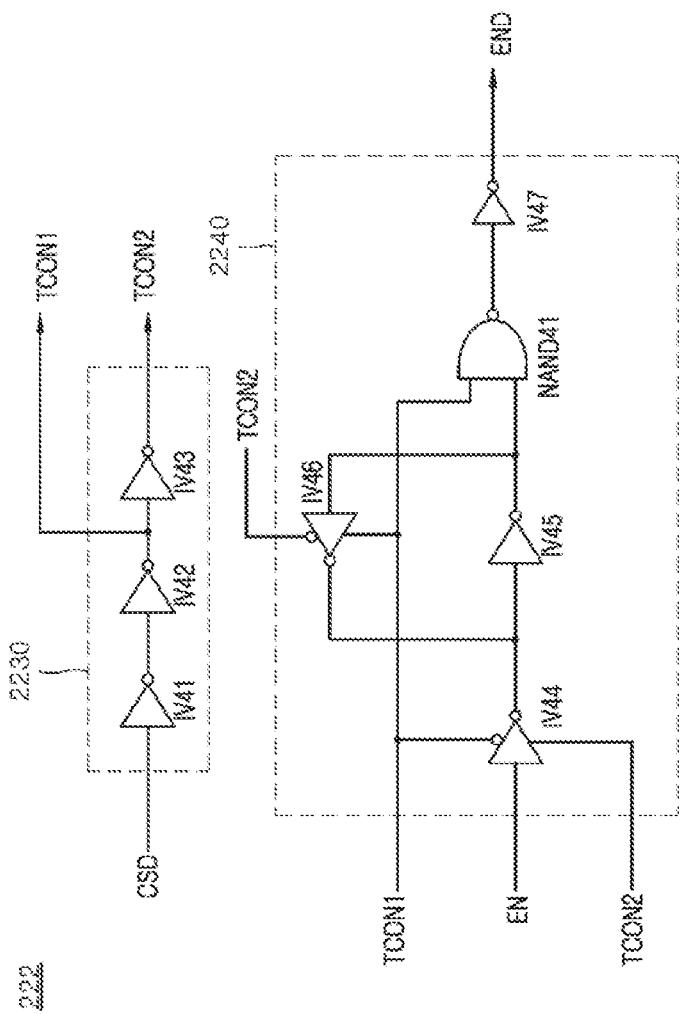
FIG. 10 is a circuit diagram illustrating a configuration of a masking control circuit included in the masking signal generation circuit illustrated in FIG. 6.

FIG. 10 is a circuit diagram illustrating a configuration of an example of the masking control circuit 222. As illustrated in FIG. 10, the masking control circuit 222 may include a transfer control signal generation circuit 2230 and a signal transfer circuit 2240.

The transfer control signal generation circuit 2230 may be realized using inverters IV41, IV42, and IV43. The transfer control signal generation circuit 2230 may delay the delayed chip selection signal CSD to generate a first transfer control signal TCON1. The transfer control signal generation circuit 2230 may inversely buffer the first transfer control signal TCON1 to generate a second transfer control signal TCON2.

The signal transfer circuit 2240 may be realized using inverters IV44, IV45, IV46, and IV47 and a NAND gate NAND41. The signal transfer circuit 2240 may receive the enablement signal EN when the first transfer control signal TCON1 has a logic "low" level and the second transfer control signal TCON2 has a logic "high" level. When the first transfer control signal TCON1 has a logic "high" level and the second transfer control signal TCON2 has a logic "low" level, the signal transfer circuit 2240 may latch the enablement signal EN input previously. When the first transfer control signal TCON1 has a logic "high" level and the second transfer control signal TCON2 has a logic "low" level, the signal transfer circuit 2240 may delay the latched signal of the enablement signal EN to generate the delayed enablement signal END.

Figure 11:
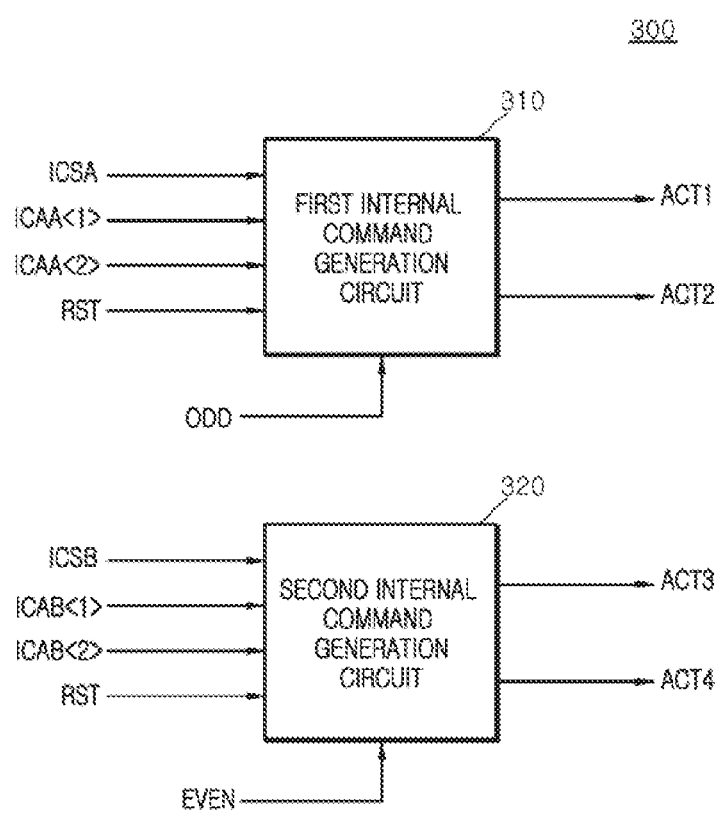
FIG. 11 is a block diagram illustrating a configuration of an internal command generation circuit included in the semiconductor device illustrated in FIG. 2.

FIG. 11 is a block diagram illustrating a configuration of an example of the internal command generation circuit 300. As illustrated in FIG. 11, the internal command generation circuit 300 may include a first internal command generation circuit 310 and a second internal command generation circuit 320.

The first internal command generation circuit 310 may generate the first active command ACT1 and the second active command ACT2 which are initialized by a reset signal RST. The first internal command generation circuit 310 may generate the first active command ACT1 and the second active command ACT2 which are sequentially enabled when the first internal chip selection signal ICSA and the first and second bit signals ICAA<1:2> of the first internal command/address signal have a predetermined logic level combination. The reset signal RST may be set as a signal including a pulse having a logic "low" level which is created during an initialization operation that is performed when an operation of the semiconductor system 1 starts.

The second internal command generation circuit 320 may generate the third active command ACT3 and the fourth active command ACT4 which are initialized by the reset signal RST. The second internal command generation circuit 320 may generate the third active command ACT3 and the fourth active command ACT4 which are sequentially enabled when the second internal chip selection signal ICSB and the first and second bit signals ICAB<2> of the second internal command/address signal have a predetermined logic level combination.

Figure 12:
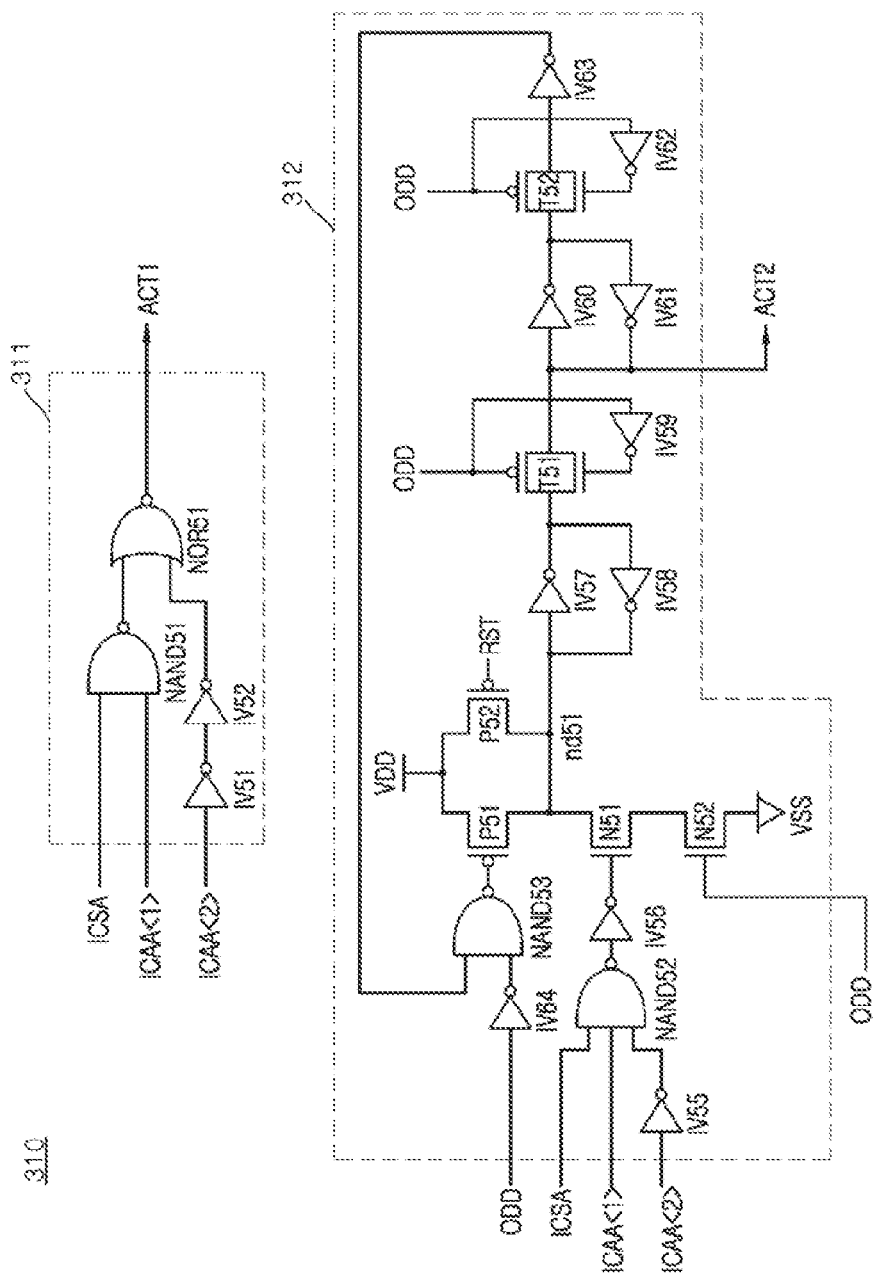
FIG. 12 is a circuit diagram illustrating a configuration of a first internal command generation circuit included in the internal command generation circuit illustrated in FIG. 11.

FIG. 12 is a circuit diagram illustrating a configuration of an example of the first internal command generation circuit 310. As illustrated in FIG. 12, the first internal command generation circuit 310 may include a first active command generation circuit 311 and a second active command generation circuit 312.

The first active command generation circuit 311 may be realized using inverters IV51 and IV52, a NAND gate NAND51, and a NOR gate NOR51.

The first active command generation circuit 311 may generate the first active command ACT1 which is enabled when the first internal chip selection signal ICSA and the first and second bit signals ICAA<1:2> of the first internal command/address signal have a predetermined logic level combination. The first active command generation circuit 311 may generate the first active command ACT1 which is enabled to have a logic "high" level when the first internal chip selection signal ICSA has a logic "high" level, the first bit signal ICAA<1> of the first internal command/address signal has a logic "high" level, and the second bit signal ICAA<2> of the first internal command/address signal has a logic "low" level.

The second active command generation circuit 312 may be realized using inverters IV55, IV56, IV57, IV58, IV59, IV60, IV61, IV62, IV63, and IV64, NAND gates NAND52 and NAND53, PMOS transistors P51 and P52, NMOS transistors N51 and N52, and transfer gates T51 and T52.

The second active command generation circuit 312 may pull up an internal node nd51 to the power supply voltage VDD by the reset signal RST generated to include a pulse having a logic "low" level when the semiconductor system 1 operates. The second active command generation circuit 312 may pull down the internal node nd51 to the ground voltage VSS when the first internal clock signal ODD has a logic "high" level, the first internal chip selection signal ICSA has a logic "high" level, the first bit signal ICAA<1> of the first internal command/address signal has a logic "high" level, and the second bit signal ICAA<2> of the first internal command/address signal has a logic "low" level. When the first internal clock signal ODD is generated to have a logic "low" level, the second active command generation circuit 312 may inversely buffer a signal of the internal node nd51 pulled down to the ground voltage VSS to generate the second active command ACT2 which is enabled to have a logic "high" level. The second active command generation circuit 312 may pull up the internal node nd51 to the power supply voltage VDD when the first internal clock signal ODD is generated to have a logic "low" level after being generated to have a logic "high" level.

Figure 13:
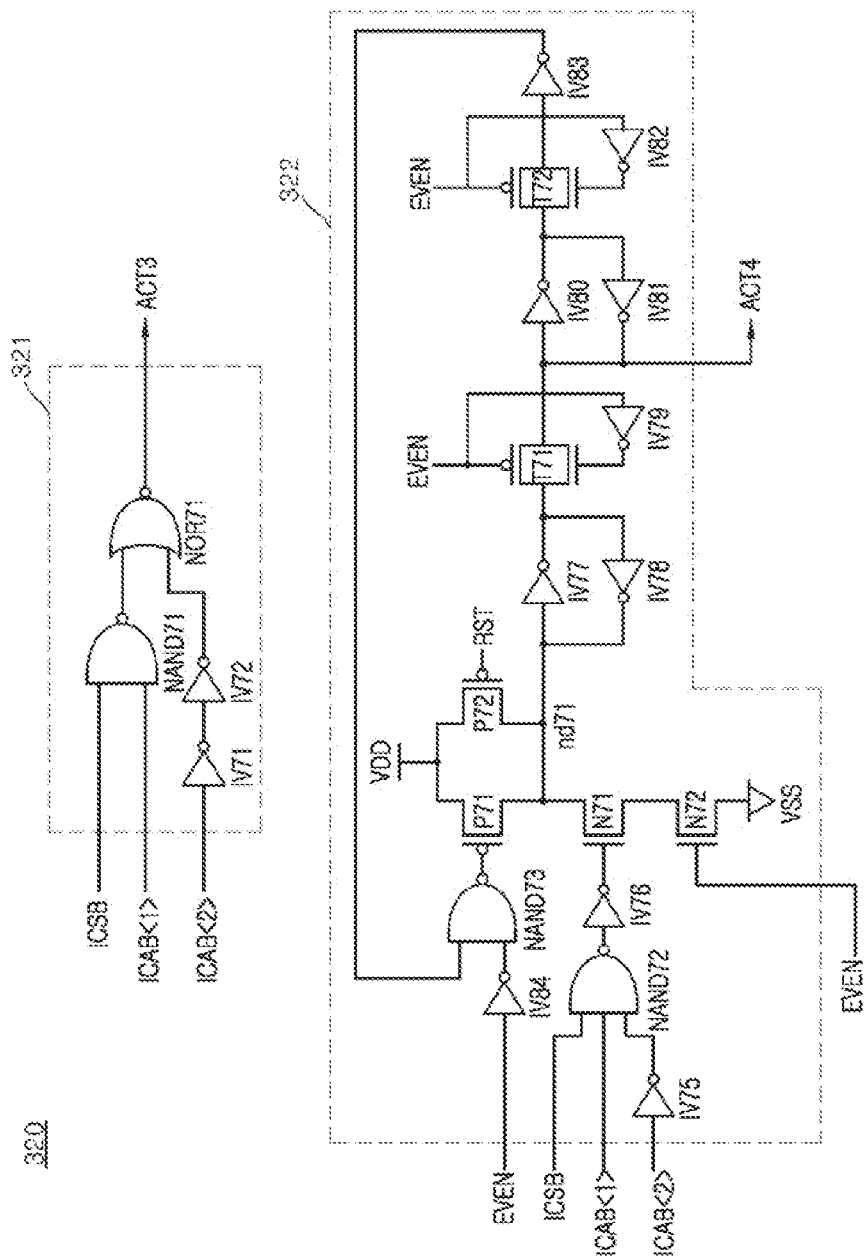
FIG. 13 is a circuit diagram illustrating a configuration of a second internal command generation circuit included in the internal command generation circuit illustrated in FIG. 11.

FIG. 13 is a circuit diagram illustrating a configuration of an example of the second internal command generation circuit 320. As illustrated in FIG. 13, the second internal command generation circuit 320 may include a third active command generation circuit 321 and a fourth active command generation circuit 322.

The third active command generation circuit 321 may be realized using inverters IV71 and IV72, a NAND gate NAND71, and a NOR gate NOR71.

The third active command generation circuit 321 may generate the third active command ACT3 which is enabled when the second internal chip selection signal ICSB and the first and second bit signals ICAB<1:2> of the second internal command/address signal have a predetermined logic level combination. The third active command generation circuit 321 may generate the third active command ACT3 which is enabled to have a logic "high" level when the second internal chip selection signal ICSB has a logic "high" level, the first bit signal ICAB<1> of the second internal command/address signal has a logic "high" level, and the second bit signal ICAB<2> of the second internal command/address signal has a logic "low" level.

The fourth active command generation circuit 322 may be realized using inverters IV75, IV76, IV77, IV78, IV79, IV80, IV81, IV82, IV83, and IV84, NAND gates NAND72 and NAND73, PMOS transistors P71 and P72, NMOS transistors N71 and N72, and transfer gates T71 and T72.

The fourth active command generation circuit 322 may pull up an internal node nd71 to the power supply voltage VDD by the reset signal RST generated to include a pulse having a logic "low" level when the semiconductor system 1 operates. The fourth active command generation circuit 322 may pull down the internal node nd71 to the ground voltage VSS when the second internal clock signal EVEN has a logic "high" level, the second internal chip selection signal ICSB has a logic "high" level, the first bit signal ICAB<1> of the second internal command/address signal has a logic "high" level, and the second bit signal ICAB<2> of the second internal command/address signal has a logic "low" level. When the second internal clock signal EVEN is generated to have a logic "low" level, the fourth active command generation circuit 322 may inversely buffer a signal of the internal node nd71 pulled down to the ground voltage VSS to generate the fourth active command ACT4 which is enabled to have a logic "high" level. The fourth active command generation circuit 322 may pull up the internal node nd71 to the power supply voltage VDD when the second internal clock signal EVEN is generated to have a logic "low" level after being generated to have a logic "high" level.

Figure 14:
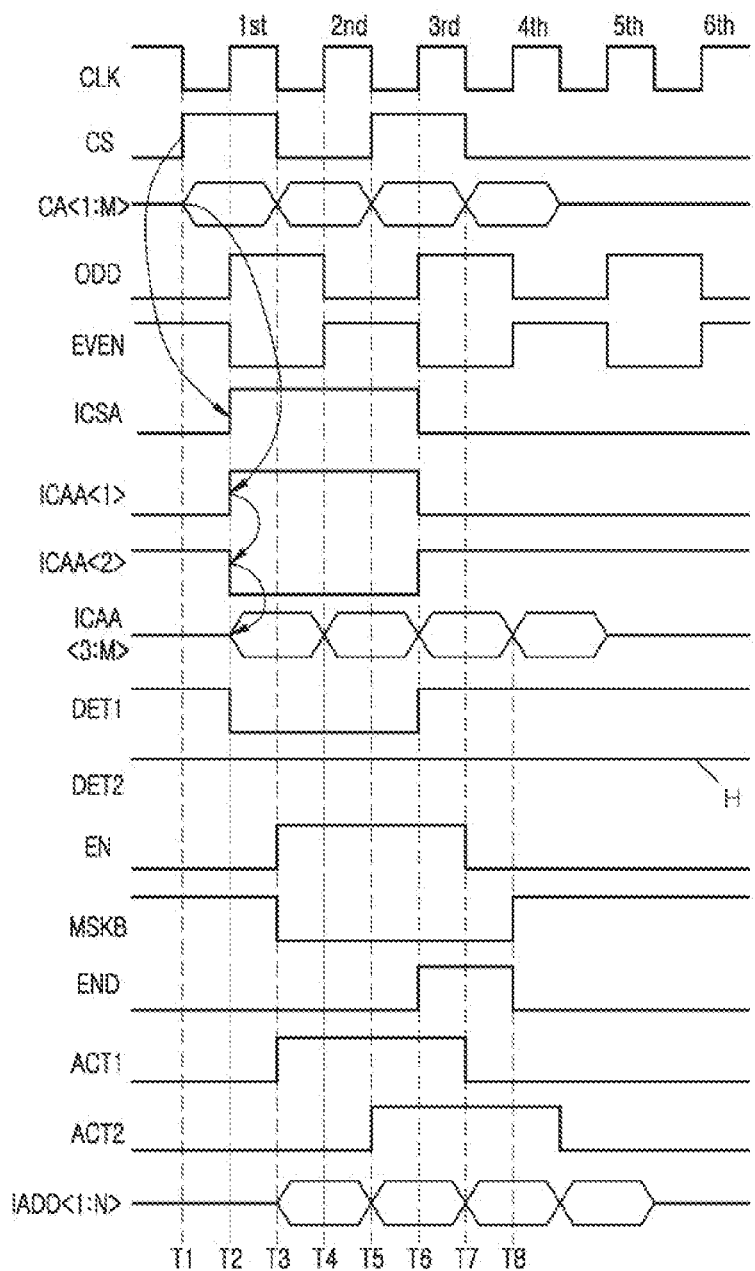
FIGS. 14 and 15 are timing diagrams illustrating an operation of a semiconductor system according to an embodiment of the present disclosure.

An operation of the semiconductor system 1 according to an embodiment of the present disclosure will be described hereinafter with reference to FIG. 14 in conjunction with a case that the chip selection signal CS and the command/address signal CA<1:M> are input in synchronization with the odd pulses of the clock signal CLK.

At a point in time "T1", the controller 10 may output the chip selection signal CS having a logic "high" level and the command/address signal CA<1:M> to perform the active operation.

At a point in time "T2", the internal clock generation circuit 100 may be synchronized with an odd pulse ($1^{st}$) of the clock signal CLK to generate the first internal clock signal ODD which is enabled to have a logic "high" level.

The input control circuit 200 may be synchronized with a first pulse of the first internal clock signal ODD to generate the first internal chip selection signal ICSA having a logic "high" level from the chip selection signal CS. The input control circuit 200 may be synchronized with a first pulse of the first internal clock signal ODD to generate the first bit signal ICAA<1> having a logic "high" level of the first internal command/address signal from the first bit signal CA<1> of the command/address signal CA<1:M>. The input control circuit 200 may be synchronized with a first pulse of the first internal clock signal ODD to generate the second bit signal ICAA<2> having a logic "low" level of the first internal command/address signal from the second bit signal CA<2> of the command/address signal CA<1:M>. The input control circuit 200 may be synchronized with a first pulse of the first internal clock signal ODD to generate the third to $M^{th}$ bit signals ICAA<3:M> of the first internal command/address signal from the third to $M^{th}$ bit signals CA<3:M> of the command/address signal CA<1:M>.

The first detection signal generation circuit 2211 may receive the first internal chip selection signal ICSA having a logic "high" level, the first bit signal ICAA<1> having a logic "high" level of the first internal command/address signal, and the second bit signal ICAA<2> having a logic "low" level of the first internal command/address signal to generate the first detection signal DET1 which is enabled to have a logic "low" level. In such a case, the second detection signal generation circuit 2212 may generate the second detection signal DET2 having a logic "high" level because the second internal chip selection signal ICSB and the first and second bit signals ICAB<1:2> of the second internal command/address signal are not generated.

At a point in time "T3", the controller 10 may output the chip selection signal CS having a logic "low" level and the command/address signal CA<1:M>.

The first active command generation circuit 311 may receive the first internal chip selection signal ICSA having a logic "high" level, the first bit signal ICAA<1> having a logic "high" level of the first internal command/address signal, and the second bit signal ICAA<2> having a logic "low" level of the first internal command/address signal, which are generated at the point in time "T2", to generate the first active command ACT1 which is enabled to have a logic "high" level.

The internal address generation circuit 400 may decode the third to $M^{th}$ bit signals ICAA<3:M> of the first internal command/address signal, which are generated at the point in time "T2", to generate the internal address IADD<1:N>.

The core circuit 500 may perform the active operation based on the first active command ACT1 having a logic "high" level and the internal address IADD<1:N>. In such a case, the active operation may be one of the write operation for storing the data DATA, the read operation for outputting the data DATA, and the refresh operation.

The masking signal output circuit 2220 may receive the first detection signal DET1 having a logic "low" level to generate the enablement signal EN which is enabled to have a logic "high" level. The masking signal output circuit 2220 may receive the first detection signal DET1 having a logic "low" level to generate the masking signal MSKB which is enabled to have a logic "low" level.

At a point in time "T4", the internal clock generation circuit 100 may be synchronized with an even pulse ($2^{nd}$) of the clock signal CLK to generate the second internal clock signal EVEN which is enabled to have a logic "high" level.

The input control circuit 200 may be synchronized with the second internal clock signal EVEN to generate the third to $M^{th}$ bit signals ICAB<3:M> of the second internal command/address signal from the third to $M^{th}$ bit signals CA<3:M> of the command/address signal CA<1:M>.

At a point in time "T5", the second active command generation circuit 312 may receive the first internal clock signal ODD to generate the second active command ACT2 which is enabled to have a logic "high" level.

The internal address generation circuit 400 may decode the third to $M^{th}$ bit signals ICAB<3:M> of the second internal command/address signal, which are generated at the point in time "T4", to generate the internal address IADD<1:N>.

The core circuit 500 may perform the active operation based on the second active command ACT2 having a logic "high" level and the internal address IADD<1:N>. In such a case, the active operation may be one of the write operation for storing the data DATA, the read operation for outputting the data DATA, and the refresh operation.

The controller 10 may output the chip selection signal CS having a logic "high" level and the command/address signal CA<1:M> to perform the active operation.

At a point in time "T6", the internal clock generation circuit 100 may be synchronized with an odd pulse ($3^{rd}$) of the clock signal CLK to generate the first internal clock signal ODD which is enabled to have a logic "high" level.

The input control circuit 200 may be synchronized with a second pulse of the first internal clock signal ODD to inhibit the generation of the first internal chip selection signal ICSA based on the masking signal MSKB having a logic "low" level. The input control circuit 200 may be synchronized with a second pulse of the first internal clock signal ODD to generate the first bit signal ICAA<1> having a logic "low" level of the first internal command/address signal from the first bit signal CA<1> of the command/address signal CA<1:M>. The input control circuit 200 may be synchronized with a second pulse of the first internal clock signal ODD to generate the second bit signal ICAA<2> having a logic "high" level of the first internal command/address signal from the second bit signal CA<2> of the command/address signal CA<1:M>. The input control circuit 200 may be synchronized with a second pulse of the first internal clock signal ODD to generate the third to $M^{th}$ bit signals ICAA<3:M> of the first internal command/address signal from the third to $M^{th}$ bit signals CA<3:M> of the command/address signal CA<1:M>.

The first detection signal generation circuit 2211 may receive the first internal chip selection signal ICSA having a logic "low" level, the first bit signal ICAA<1> having a logic "low" level of the first internal command/address signal, and the second bit signal ICAA<2> having a logic "high" level of the first internal command/address signal to generate the first detection signal DET1 which is disabled to have a logic "high" level. In such a case, the second detection signal generation circuit 2212 may generate the second detection signal DET2 having a logic "high" level because the second internal chip selection signal ICSB and the first and second bit signals ICAB<1:2> of the second internal command/address signal are not generated.

The masking control circuit 222 may delay the enablement signal EN, which is generated at the point in time "T3", to generate the delayed enablement signal END.

At a point in time "T7", the internal address generation circuit 400 may decode the third to $M^{th}$ bit signals ICAA<3:M> of the first internal command/address signal, which are generated at the point in time "T6", to generate the internal address IADD<1:N>.

The core circuit 500 may perform the active operation based on the second active command ACT2 having a logic "high" level and the internal address IADD<1:N>. In such a case, the active operation may be one of the write operation for storing the data DATA, the read operation for outputting the data DATA, and the refresh operation.

At a point in time "T8", the masking control circuit 222 may delay the enablement signal EN to generate the delayed enablement signal END which is disabled to have a logic "low" level.

The masking signal output circuit 2220 may receive the first detection signal DET1 having a logic "high" level, the second detection signal DET2 having a logic "high" level, and the delayed enablement signal END having a logic "low" level to generate the masking signal MSKB which is disabled to have a logic "high" level.

Subsequently, the semiconductor device 20 may generate the first active command ACT1 and the second active command ACT2 based on the chip selection signal CS and the command/address signal CA<1:M> to perform the active operation.

Figure 15:
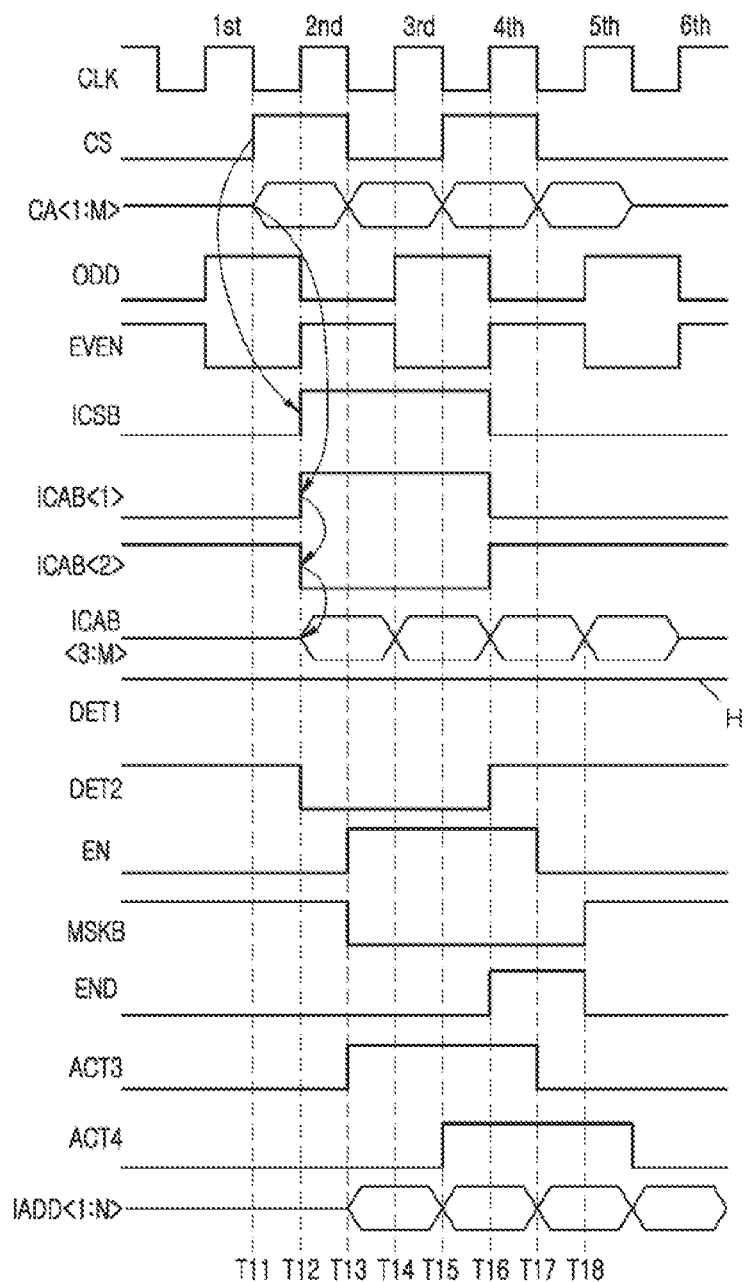

Another operation of the semiconductor system according to an embodiment of the present disclosure will be described hereinafter with reference to FIG. 15 in conjunction with a case that the chip selection signal CS and the command/address signal CA<1:M> are input in synchronization with the even pulses of the clock signal CLK.

At a point in time "T11", the controller 10 may output the chip selection signal CS having a logic "high" level and the command/address signal CA<1:M> to perform the active operation.

At a point in time "T12", the internal clock generation circuit 100 may be synchronized with an even puke (2nd) of the clock signal CLK to generate the second internal clock signal EVEN which is enabled to have a logic "high" level.

The input control circuit 200 may be synchronized with a first pulse of the second internal clock signal EVEN to generate the second internal chip selection signal ICSB having a logic "high" level from the chip selection signal CS. The input control circuit 200 may be synchronized with a first pulse of the second internal clock signal EVEN to generate the first bit signal ICAB<1> having a logic "high" level of the second internal command/address signal from the first bit signal CA<1> of the command/address signal CA<1:M>. The input control circuit 200 may be synchronized with a first pulse of the second internal clock signal EVEN to generate the second bit signal ICAB<2> having a logic "low" level of the second internal command/address signal from the second bit signal CA<2> of the command/address signal CA<1:M>. The input control circuit 200 may be synchronized with a first pulse of the second internal clock signal EVEN to generate the third to $M^{th}$ bit signals ICAB<3:M> of the second internal command/address signal from the third to $M^{th}$ bit signals CA<3:M> of the command/address signal CA<1:M>.

The second detection signal generation circuit 2212 may receive the second internal chip selection signal ICSB having a logic "high" level, the first bit signal ICAB<1> having a logic "high" level of the second internal command/address signal, and the second bit signal ICAB<2> having a logic "low" level of the second internal command/address signal to generate the second detection signal DET2 which is enabled to have a logic "low" level. In such a case, the first detection signal generation circuit 2211 may generate the first detection signal DET1 having a logic "high" level because the first internal chip selection signal ICSA and the first and second bit signals ICAA<1:2> of the first internal command/address signal are not generated.

At a point in time "T13", the controller 10 may output the chip selection signal CS having a logic "low" level and the command/address signal CA<1: M>.

The third active command generation circuit 321 may receive the second internal chip selection signal ICSB having a logic "high" level, the first bit signal ICAB<1> having a logic "high" level of the second internal command/address signal, and the second bit signal ICAB<2> having a logic "low" level of the second internal command/address signal, which are generated at the point in time "T12", to generate the third active command ACT3 which is enabled to have a logic "high" level.

The internal address generation circuit 400 may decode the third to $M^U$ bit signals ICAB<3:M> of the second internal command/address signal, which are generated at the point in time "T12", to generate the internal address IADD<1:N>.

The core circuit 500 may perform the active operation based on the third active command ACT3 having a logic "high" level and the internal address IADD<1:N>. In such a case, the active operation may be one of the write operation for storing the data DATA, the read operation for outputting the data DATA, and the refresh operation.

The masking signal output circuit 2220 may receive the second detection signal DET2 having a logic "low" level to generate the enablement signal EN which is enabled to have a logic "high" level. The masking signal output circuit 2220 may receive the second detection signal DET2 having a logic "low" level to generate the masking signal MSKB which is enabled to have a logic "low" level.

At a point in time "T14", the internal clock generation circuit 100 may be synchronized with an odd pulse ($3^{rd}$) of the clock signal CLK to generate the first internal clock signal ODD which is enabled to have a logic "high" level.

The input control circuit 200 may be synchronized with the first internal clock signal ODD to generate the third to $M^{th}$ bit signals ICAA<3:M> of the first internal command/address signal from the third to $M^{th}$ bit signals CA<3:M> of the command/address signal CA<1:M>.

At a point in time "T15", the fourth active command generation circuit 322 may receive the second internal clock signal EVEN to generate the fourth active command ACT4 which is enabled to have a logic "high" level.

The internal address generation circuit 400 may decode the third to $M^{th}$ bit signals ICAA<3:M> of the first internal command/address signal, which are generated at the point in time "T14", to generate the internal address IADD<1:N>.

The core circuit 500 may perform the active operation based on the fourth active command ACT4 having a logic "high" level and the internal address IADD<1:N>. In such a case, the active operation may be one of the write operation for storing the data DATA, the read operation for outputting the data DATA, and the refresh operation.

The controller 10 may output the chip selection signal CS having a logic "high" level and the command/address signal CA<1: M> to perform the active operation.

At a point in time "T16", the internal clock generation circuit 100 may be synchronized with an even pulse ($4^{th}$) of the clock signal CLK to generate the second internal clock signal EVEN which is enabled to have a logic "high" level.

The input control circuit 200 may be synchronized with a second pulse of the second internal clock signal EVEN to inhibit the generation of the second internal chip selection signal ICSB based on the masking signal MSKB having a logic "low" level. The input control circuit 200 may be synchronized with a second pulse of the second internal clock signal EVEN to generate the first bit signal ICAB<1> having a logic "low" level of the second internal command/address signal from the first bit signal CA<1> of the command/address signal CA<1:M>. The input control circuit 200 may be synchronized with a second pulse of the second internal clock signal EVEN to generate the second bit signal ICAB<2> having a logic "high" level of the second internal command/address signal from the second bit signal CA<2> of the command/address signal CA<1:M>. The input control circuit 200 may be synchronized with a second pulse of the second internal clock signal EVEN to generate the third to $M^{th}$ bit signals ICAB<3:M> of the second internal command/address signal from the third to $M^{th}$ bit signals CA<3:M> of the command/address signal CA<1:M>.

The second detection signal generation circuit 2212 may receive the second internal chip selection signal ICSB having a logic "low" level, the first bit signal ICAB<1> having a logic "low" level of the second internal command/address signal, and the second bit signal ICAB<2> having a logic "high" level of the second internal command/address signal to generate the second detection signal DET2 which is disabled to have a logic "high" level. In such a case, the first detection signal generation circuit 2211 may generate the first detection signal DET1 having a logic "high" level because the first internal chip selection signal ICSA and the first and second bit signals ICAA<1:2> of the first internal command/address signal are not generated.

The masking control circuit 222 may delay the enablement signal EN, which is generated at the point in time "T13", to generate the delayed enablement signal END.

At a point in time "T17", the internal address generation circuit 400 may decode the third to $M^{th}$ bit signals ICAB<3: M> of the second internal command/address signal, which are generated at the point in time "T16", to generate the internal address IADD<1:N>.

The core circuit 500 may perform the active operation based on the fourth active command ACT4 having a logic "high" level and the internal address IADD<1:N>. In such a case, the active operation may be one of the write operation for storing the data DATA, the read operation for outputting the data DATA, and the refresh operation.

At a point in time "T18", the masking control circuit 222 may delay the enablement signal EN to generate the delayed enablement signal END which is disabled to have a logic "low" level.

The masking signal output circuit 2220 may receive the first detection signal DET1 having a logic "high" level, the second detection signal DET2 having a logic "high" level, and the delayed enablement signal END having a logic "low" level to generate the masking signal MSKB which is disabled to have a logic "high" level.

Subsequently, the semiconductor device 20 may generate the third active command ACT3 and the fourth active command ACT4 based on the chip selection signal CS and the command/address signal CA<1:M> to perform the active operation.

As described above, a semiconductor system according to an embodiment may interrupt generation of an internal chip selection signal for generating an active command when a chip selection signal and a command/address signal, which are iteratively input in synchronization with a clock signal, have a logic level combination for performing an active operation. Thus, it may be possible to prevent generation of an unnecessary active command. In addition, the semiconductor system may perform a first active operation based on the chip selection signal and the command/address signal which are iteratively input in synchronization with the clock signal and may interrupt generation of the internal chip selection signal for performing a second active operation to prevent the generation of the unnecessary active command. Accordingly, it may be possible to improve the reliability of the active operation.

Figure 16:
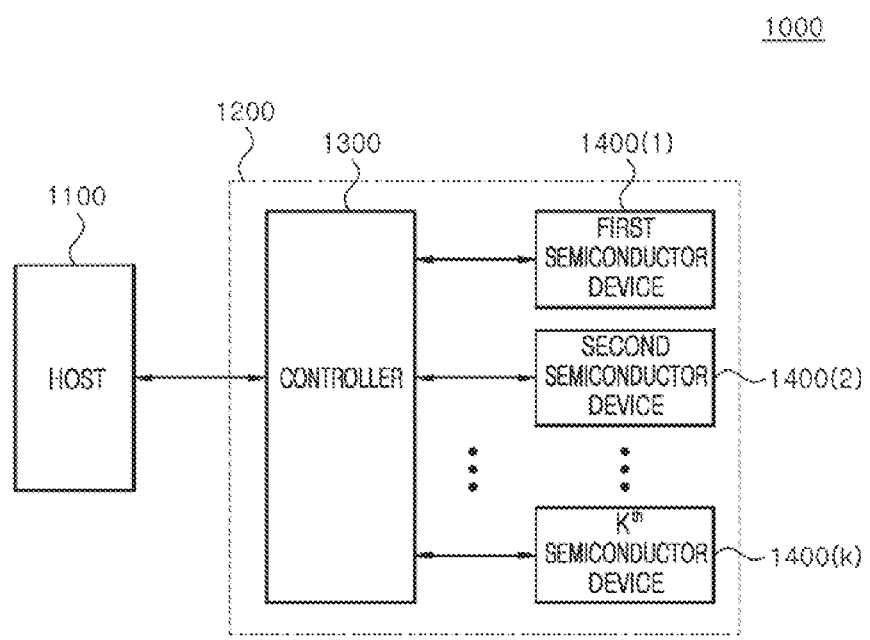
FIG. 16 is a block diagram illustrating a configuration of an electronic system employing the semiconductor system illustrated in FIGS. 1 to 15.

FIG. 16 is a block diagram illustrating a configuration of an electronic system 1000 according to an embodiment of the present disclosure. As illustrated in FIG. 16, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform an active operation. Each of the semiconductor devices 1400(K:1) may interrupt generation of an internal chip selection signal for generating an active command when a chip selection signal and a command/address signal, which are successively input in synchronization with a clock signal, have a logic level combination for performing the active operation. Thus, it may be possible to prevent generation of an unnecessary active command. In addition, each of the semiconductor devices 1400(K:1) may perform a first active operation based on the chip selection signal and the command/address signal which are successively input in synchronization with the clock signal and may interrupt generation of the internal chip selection signal for performing a second active operation to prevent the generation of the unnecessary active command. Accordingly, it may be possible to improve the reliability of the active operation.

The controller 1300 may be realized using the controller 10 illustrated in FIG. 1. Each of the semiconductor devices 1400(K:1) may be realized using the semiconductor device 20 illustrated in FIG. 1. In some embodiments, the semiconductor device 20 may be realized using one of a dynamic random access memory (DRAM), a phase change random access memory (PRAM), a resistive random access memory (RRAM), a magnetic random access memory (MRAM), and a ferroelectric random access memory (FRAM).

What is claimed is:

1. A semiconductor device comprising:
an input control circuit configured to generate an internal chip selection signal in synchronization with a first pulse of an internal clock signal, the internal chip selection signal generated from a chip selection signal, configured to generate a first internal command and address (command/address) signal in synchronization with the first pulse of the internal clock signal, the first internal command/address signal generated from a command/address signal, and configured to inhibit generation of the internal chip selection signal in synchronization with a second pulse of the internal clock signal; and
an internal command generation circuit configured to generate a first active command and a second active command which are sequentially enabled when the internal chip selection signal and the first internal command/address signal have a predetermined logic level combination.

2. The semiconductor device of claim 1, wherein the chip selection signal and the command/address signal are successively inputted to the semiconductor device in synchronization with an odd pulse or an even pulse of a clock signal provided by an external device.

3. The semiconductor device of claim 1,
wherein the command/address signal input while the chip selection signal has a first logic level is set as a signal for generating the first and second active commands; and
wherein the command/address signal input while the chip selection signal has a second logic level is set as a signal for generating an internal address.

4. The semiconductor device of claim 1, wherein the internal clock signal is a signal which is generated in synchronization with an odd pulse or an even pulse included in a clock signal provided by an external device.

5. The semiconductor device of claim 1, wherein the input control circuit inhibits the generation of the internal chip selection signal when the chip selection signal and the command/address signal input in synchronization with the second pulse of the internal clock signal have a predetermined logic level combination.

6. The semiconductor device of claim 1, wherein the input control circuit includes:
an input buffer circuit configured to compare the chip selection signal with a reference voltage and generate the internal chip selection signal in synchronization with the internal clock signal, configured to compare the command/address signal with the reference voltage and generate the first internal command/address signal in synchronization with the internal clock signal, and configured to inhibit the generation of the internal chip selection signal when a masking signal is enabled; and
a masking signal generation circuit configured to receive a delayed chip selection signal to generate the masking signal which is enabled when the internal chip selection signal and the first internal command/address signal have a predetermined logic level combination.

7. The semiconductor device of claim 6, wherein the input buffer circuit includes:
   a buffer circuit configured to compare the chip selection signal with the reference voltage to generate an input chip selection signal and configured to compare the command/address signal with the reference voltage to generate an input command/address signal;
   a delay circuit configured to delay the input chip selection signal to generate the delayed chip selection signal and configured to delay the input command/address signal to generate a delayed input command/address signal; and
   an internal command/address generation circuit configured to generate the internal chip selection signal in synchronization with the internal clock signal, the internal chip selection signal generated from the delayed chip selection signal according to the masking signal and configured to generate the first internal command/address signal in synchronization with the internal clock signal, the first internal command/address signal generated from the delayed input command/address signal.

8. The semiconductor device of claim 7, wherein the internal command/address generation circuit is configured to inhibit the delayed chip selection signal from being used to generate the internal chip selection signal while the masking signal is enabled.

9. The semiconductor device of claim 6, wherein the masking signal generation circuit includes:
   a detection circuit configured to generate an enablement signal and the masking signal which are enabled when the internal chip selection signal and the first internal command/address signal have a predetermined logic level combination and configured to generate the masking signal which is enabled when a delayed enablement signal is input; and
   a masking control circuit configured to delay the enablement signal to generate the delayed enablement signal when the delayed chip selection signal is enabled.

10. The semiconductor device of claim 9, wherein the detection circuit includes:
    a detection signal generation circuit configured to generate a detection signal which is enabled when the internal chip selection signal and the first internal command/address signal have a predetermined logic level combination; and
    a masking signal output circuit configured to enable the enablement signal and the masking signal when the detection signal is enabled and configured to enable the masking signal when the delayed enablement signal is enabled.

11. The semiconductor device of claim 10, wherein the masking signal output circuit includes:
    a drive circuit configured to drive an internal node according a logic level of the detection signal to generate the enablement signal; and
    a logic circuit configured to generate the masking signal which is enabled when any one of the enablement signal and the delayed enablement signal is enabled.

12. The semiconductor device of claim 9, wherein the masking control circuit includes:
    a transfer control signal generation circuit configured to delay the delayed chip selection signal to generate a first transfer control signal and configured to inversely buffer the first transfer control signal to generate a second transfer control signal; and
    a signal transfer circuit configured to delay the enablement signal according to logic levels of the first and second transfer control signals to generate the delayed enablement signal.

13. The semiconductor device of claim 1, wherein the internal command generation circuit includes:
    a first internal command generation circuit configured to generate the first active command which is enabled when the internal chip selection signal and the first internal command/address signal have a predetermined logic level combination; and
    a second internal command generation circuit configured to be initialized by a reset signal and configured to generate the second active command in synchronization with the internal clock signal, the second active command generated when the internal chip selection signal and the first internal command/address signal have a predetermined logic level combination.

14. The semiconductor device of claim 1, wherein the input control circuit is configured to generate a second internal command/address signal from the command/address signal which is input in synchronization with a first pulse and a second pulse of the internal clock signal.

15. The semiconductor device of claim 14, further comprising:
    an internal address generation circuit configured to decode the second internal command/address signal to generate an internal address; and
    a core circuit configured to perform an active operation for receiving or outputting data based on the first and second active commands and the internal address.

16. A semiconductor device comprising:
    an input control circuit configured to generate a first internal chip selection signal in synchronization with a first pulse of a first internal clock signal, configured to generate a first internal command/address signal in synchronization with the first pulse of the first internal clock signal, the first internal command and address (command/address) signal generated from a chip selection signal and a command/address signal, configured to generate a second internal chip selection signal in synchronization with a first pulse of a second internal clock signal, configured to generate a second internal command/address signal in synchronization with the first pulse of the second internal clock signal, the second internal command/address signal generated from the chip selection signal and the command/address signal, and configured to inhibit generation of the first and second internal chip selection signals in synchronization with second pulses of the first and second internal clock signals; and
    an internal command generation circuit configured to generate a first active command and a second active command which are sequentially enabled when the first internal chip selection signal and the first internal command/address signal have a predetermined logic level combination and configured to generate a third active command and a fourth active command which are sequentially enabled when the second internal chip selection signal and the second internal command/address signal have a predetermined logic level combination.

17. The semiconductor device of claim 16, wherein the chip selection signal and the command/address signal are successively input in synchronization with a first pulse of the first internal clock signal and then successively input in synchronization with a second pulse of the first internal clock signal and are successively input in synchronization with a first pulse of the second internal clock signal and then successively input in synchronization with a second pulse of the second internal clock signal.

18. The semiconductor device of claim 16,
wherein the first and second pulses of the first internal clock signal are enabled in synchronization with odd pulses included in a clock signal provided by an external device; and
wherein the first and second pulses of the second internal clock signal are enabled in synchronization with even pulses included in the clock signal.

19. The semiconductor device of claim 16, wherein the input control circuit is configured to inhibit the first and second internal chip selection signals from being generated when the chip selection signal and the command/address signal input in synchronization with the second pulses of the first and second internal clock signals have a predetermined logic level combination.

20. The semiconductor device of claim 16, wherein the input control circuit includes:
an input buffer circuit configured to compare the chip selection signal with a reference voltage in and generate the first and second internal chip selection signals in synchronization with the first and second internal clock signals, configured to compare the command/address signal with the reference voltage and generate the first and second internal command/address signals in synchronization with the first and second internal clock signals, and configured to inhibit the generation of the first and second internal chip selection signals when a masking signal is enabled; and
a masking signal generation circuit configured to receive a delayed chip selection signal to generate the masking signal which is enabled when the first and second internal chip selection signals and the first and second internal command/address signals have a predetermined logic level combination.

21. The semiconductor device of claim 20, wherein the input buffer circuit includes:
a buffer circuit configured to compare the chip selection signal with the reference voltage to generate an input chip selection signal and configured to compare the command/address signal with the reference voltage to generate an input command/address signal;
a delay circuit configured to delay the input chip selection signal to generate the delayed chip selection signal and configured to delay the input command/address signal to generate a delayed input command/address signal; and
an internal command/address generation circuit configured to generate the first and second internal chip selection signals in synchronization with the first and second internal clock signals, the first and second internal chip selection signals generated from the delayed chip selection signal according to the masking signal and configured to generate the first and second internal command/address signals in synchronization with the first and second internal clock signals, the first and second internal command/address signals generated from the delayed input command/address signal.

22. The semiconductor device of claim 21, wherein the internal command/address generation circuit is configured to inhibit the delayed chip selection signal from being inputted while the masking signal is enabled.

23. The semiconductor device of claim 20, wherein the masking signal generation circuit includes:
a detection circuit configured to generate an enablement signal and the masking signal which are enabled when the first and second internal chip selection signals and the first and second internal command/address signals have a predetermined logic level combination and configured to generate the masking signal which is enabled when a delayed enablement signal is input; and
a masking control circuit configured to delay the enablement signal to generate the delayed enablement signal when the delayed chip selection signal is enabled.

24. The semiconductor device of claim 23, wherein the detection circuit includes:
a detection signal generation circuit configured to generate a first detection signal which is enabled when the first internal chip selection signal and the first internal command/address signal have a predetermined logic level combination and configured to generate a second detection signal which is enabled when the second internal chip selection signal and the second internal command/address signal have a predetermined logic level combination; and
a masking signal output circuit configured to generate the enablement signal and the masking signal when any one of the first and second detection signals is enabled and configured to generate the masking signal which is enabled by the delayed enablement signal.

25. The semiconductor device of claim 24, wherein the detection signal generation circuit includes:
a first detection signal generation circuit configured to generate the first detection signal which is enabled when the first internal chip selection signal and the first internal command/address signal have a predetermined logic level combination; and
a second detection signal generation circuit configured to generate the second detection signal which is enabled when the second internal chip selection signal and the second internal command/address signal have a predetermined logic level combination.

26. The semiconductor device of claim 24, wherein the masking signal output circuit includes:
a drive circuit configured to drive an internal node according logic levels of the first and second detection signals to generate the enablement signal; and
a logic circuit configured to generate the masking signal which is enabled when any one of the enablement signal and the delayed enablement signal is enabled.

27. The semiconductor device of claim 23, wherein the masking control circuit includes:
a transfer control signal generation circuit configured to delay the delayed chip selection signal to generate a first transfer control signal and configured to inversely buffer the first transfer control signal to generate a second transfer control signal; and
a signal transfer circuit configured to delay the enablement signal according to logic levels of the first and second transfer control signals to generate the delayed enablement signal.

28. The semiconductor device of claim 16, wherein the internal command generation circuit includes:
a first internal command generation circuit configured to be initialized by a reset signal and configured to generate the first and second active commands which are enabled when the first internal chip selection signal and the first internal command/address signal have a predetermined logic level combination; and a second internal command generation circuit configured to be initialized by the reset signal and configured to generate the third and fourth active commands which are enabled when the second internal chip selection signal and the second internal command/address signal have a predetermined logic level combination.

29. The semiconductor device of claim 28, wherein the first internal command generation circuit includes:
 a first active command generation circuit configured to generate the first active command which is enabled when the first internal chip selection signal and the first internal command/address signal have a predetermined logic level combination; and
 a second active command generation circuit configured to be initialized by the reset signal and configured to generate the second active command in synchronization with the first internal clock signal when the first internal chip selection signal and the first internal command/address signal have a predetermined logic level combination.

30. The semiconductor device of claim 28, wherein the first internal command generation circuit includes:
 a third active command generation circuit configured to generate the third active command which is enabled when the second internal chip selection signal and the second internal command/address signal have a predetermined logic level combination; and
 a fourth active command generation circuit configured to be initialized by the reset signal and configured to generate the fourth active command in synchronization with the second internal clock signal when the second internal chip selection signal and the second internal command/address signal have a predetermined logic level combination.

* * * * *